(12) United States Patent
Pyeon (10) Patent No.: US 8,069,328 B2
(45) Date of Patent: Nov. 29, 2011

(54) DAISY CHAIN CASCADE CONFIGURATION RECOGNITION TECHNIQUE

(75) Inventor: Hong Beom Pyeon, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 482 days.

(21) Appl. No.: 11/606,407

(22) Filed: Nov. 29, 2006

(65) Prior Publication Data

US 2007/0233903 A1  Oct. 4, 2007

Related U.S. Application Data

(60) Provisional application No. 60/787,710, filed on Mar. 28, 2006.

(51) Int. Cl.
 *G06F 12/00* (2006.01)
(52) U.S. Cl. .................. 711/170; 711/E12.069
(58) Field of Classification Search .................. 711/170
See application file for complete search history.

(56) References Cited

U.S. PATENT DOCUMENTS

| | | | |
|---|---|---|---|
| 4,174,536 A | 11/1979 | Misunas et al. |
| 4,617,566 A | 10/1986 | Diamond |
| 4,733,376 A | 3/1988 | Ogawa |
| 4,796,231 A | 1/1989 | Pinkham |
| 4,899,316 A | 2/1990 | Nagami |
| 5,038,299 A | 8/1991 | Maeda |
| 5,126,808 A | 6/1992 | Montalvo et al. |
| 5,132,635 A | 7/1992 | Kennedy |
| 5,136,292 A | 8/1992 | Ishida |
| 5,175,819 A | 12/1992 | Le Ngoc et al. |
| 5,204,669 A | 4/1993 | Dorfe et al. |
| 5,243,703 A | 9/1993 | Farmwald et al. |
| 5,280,539 A | 1/1994 | Yeom et al. |
| 5,319,598 A | 6/1994 | Aralis et al. |
| 5,365,484 A | 11/1994 | Cleveland et al. |
| 5,404,460 A | 4/1995 | Thomsen et al. |
| 5,430,859 A | 7/1995 | Norman et al. |
| 5,440,694 A | 8/1995 | Nakajima |
| 5,452,259 A | 9/1995 | McLaury |

(Continued)

FOREIGN PATENT DOCUMENTS

WO     WO 01/69411 A2     9/2001

OTHER PUBLICATIONS

"Toshiba MOS Digital Integrated Circuit Silicon Gate CMOS," TH58NVG1S3AFT05, Toshiba Corporation, pp. 1-32, (May 19, 2003).

(Continued)

*Primary Examiner* — Kevin Ellis
*Assistant Examiner* — Hamdy Ahmed
(74) *Attorney, Agent, or Firm* — Hamilton, Brook, Smith & Reynolds, P.C.

(57) ABSTRACT

Methods and systems provide recognition of a device in a daisy chain cascade configuration. Input circuitry at a device receives an input signal that indicates device configuration following a power-up, reset or other operation of the device. A pulse generator generates a pulse in response to the operation, the pulse occurring while the input signal indicates device configuration. A state latch register stores the state of the input signal in response to the received pulse, thereby storing a state indicating configuration of the respective device. Following this operation, the input circuitry may receive signals unrelated to the device configuration, thereby obviating the need for additional pin assignment.

28 Claims, 9 Drawing Sheets

U.S. PATENT DOCUMENTS

| | | |
|---|---|---|
| 5,473,563 A | 12/1995 | Suh et al. |
| 5,473,566 A | 12/1995 | Rao |
| 5,473,577 A | 12/1995 | Miyake et al. |
| 5,475,854 A | 12/1995 | Thomsen et al. |
| 5,596,724 A | 1/1997 | Mullins et al. |
| 5,602,780 A | 2/1997 | Diem et al. |
| 5,636,342 A | 6/1997 | Jeffries |
| 5,671,178 A | 9/1997 | Park et al. |
| 5,721,840 A | 2/1998 | Soga |
| 5,740,379 A | 4/1998 | Hartwig |
| 5,761,146 A | 6/1998 | Yoo et al. |
| 5,771,199 A | 6/1998 | Lee |
| 5,802,006 A | 9/1998 | Ohta |
| 5,806,070 A | 9/1998 | Norman et al. |
| 5,818,785 A | 10/1998 | Ohshima |
| 5,828,899 A | 10/1998 | Richard et al. |
| 5,835,935 A | 11/1998 | Estakhri et al. |
| 5,859,809 A | 1/1999 | Kim |
| 5,872,994 A | 2/1999 | Akiyama et al. |
| 5,937,425 A | 8/1999 | Ban |
| 5,938,750 A | 8/1999 | Shaberman |
| 5,941,974 A | 8/1999 | Babin |
| 5,959,930 A | 9/1999 | Sakurai |
| 5,995,405 A | 11/1999 | Trick |
| 5,995,417 A | 11/1999 | Chen et al. |
| 6,002,638 A | 12/1999 | John |
| 6,085,290 A | 7/2000 | Smith et al. |
| 6,091,660 A | 7/2000 | Sasaki et al. |
| 6,102,963 A | 8/2000 | Agrawal |
| 6,107,658 A | 8/2000 | Itoh et al. |
| 6,144,579 A | 11/2000 | Taira |
| 6,148,364 A | 11/2000 | Srinivasan et al. |
| 6,172,911 B1 | 1/2001 | Tanaka et al. |
| 6,178,135 B1 | 1/2001 | Kang |
| 6,304,921 B1 | 10/2001 | Rooke |
| 6,317,350 B1 | 11/2001 | Pereira et al. |
| 6,317,352 B1 | 11/2001 | Halbert et al. |
| 6,317,812 B1 | 11/2001 | Lofgren et al. |
| 6,378,018 B1 | 4/2002 | Tsern et al. |
| 6,438,064 B2 | 8/2002 | Ooishi |
| 6,442,098 B1 | 8/2002 | Kengeri |
| 6,535,948 B1 | 3/2003 | Wheeler et al. |
| 6,584,303 B1 | 6/2003 | Kingswood et al. |
| 6,594,183 B1 | 7/2003 | Lofgren et al. |
| 6,601,199 B1 | 7/2003 | Fukuda et al. |
| 6,611,466 B2 | 8/2003 | Lee et al. |
| 6,658,509 B1 | 12/2003 | Bonella et al. |
| 6,658,582 B1 | 12/2003 | Han |
| 6,680,904 B1 | 1/2004 | Kaplan et al. |
| 6,715,044 B2 | 3/2004 | Lofgren et al. |
| 6,718,432 B1 | 4/2004 | Srinivasan |
| 6,732,221 B2 | 5/2004 | Ban |
| 6,754,807 B1 | 6/2004 | Parthasarathy et al. |
| 6,763,426 B1 | 7/2004 | James et al. |
| 6,807,103 B2 | 10/2004 | Cavaleri et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,928,501 B2 | 8/2005 | Andreas et al. |
| 6,944,697 B2 | 9/2005 | Andreas |
| 6,950,325 B1 | 9/2005 | Chen |
| 6,967,874 B2 | 11/2005 | Hosono |
| 7,058,757 B1* | 6/2006 | Branth et al. ............ 711/108 |
| 7,073,022 B2 | 7/2006 | El-Batal et al. |
| 7,170,795 B2 | 1/2007 | Lee |
| 2003/0074505 A1 | 4/2003 | Andreas et al. |
| 2003/0128702 A1 | 7/2003 | Satoh et al. |
| 2004/0001380 A1 | 1/2004 | Becca et al. |
| 2004/0019736 A1 | 1/2004 | Kim et al. |
| 2004/0024960 A1 | 2/2004 | King et al. |
| 2004/0039854 A1 | 2/2004 | Estakhri et al. |
| 2004/0153914 A1* | 8/2004 | El-Batal ............... 714/724 |
| 2004/0199721 A1 | 10/2004 | Chen |
| 2004/0230738 A1 | 11/2004 | Lim et al. |
| 2004/0268025 A1* | 12/2004 | Matsubara et al. ........... 711/103 |
| 2005/0035895 A1 | 2/2005 | Byrne et al. |
| 2005/0086413 A1* | 4/2005 | Lee et al. ............... 710/313 |
| 2005/0095769 A1 | 5/2005 | Takase et al. |
| 2005/0160218 A1 | 7/2005 | See et al. |
| 2005/0213421 A1 | 9/2005 | Polizzi et al. |
| 2006/0050594 A1 | 3/2006 | Park |

OTHER PUBLICATIONS

"Intel® Advanced+ Boot Block Flash Memory (C3)," Intel Corporation, pp. 1-72, (May 2005).

"256 M × 8 Bit/ 128M ×16 Bit / 512M × 8 Bit NAND Flash Memory," K9K4G08U1M, K9F2G08U0M, K9F2G16U0M, Rev. 1.0, Samsung Electronics Co., Ltd., pp. 1-41, (May 6, 2005).

King, et al., "Communicating with Daisy Chained MCP42XXX Digital Potentiometers", Microchip AN747, pp. 1-8, 2001.

"High Speed Small Sectored SPI Flash Memory," Atmel Corp., pp. 1-22 (2006).

64 Megatbit CMOS 3.0 Volt Flash Memory with 50MHz SPI (2006).

"DiskOnChip H1 4Gb (512MByte) and 8 Gb (1 GByte) High Capacity Flash Disk with NAND and x2 Technology," Data Sheet, Rev. 0.5 (Preliminary), M-Systems Flash Disk Pioneers Ltd., pp. 1-66, (2005).

Tal, A., "Guidelines for Integrating DiskOnChip in a Host System," AP-DOC-1004, Rev. 1.0, M-Systems Flash Disk Pioneers Ltd., pp. 1-15, (2004).

OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, Samsung Electronics, pp. 1-125, (Dec. 23, 2005).

Kennedy, J., et al., "A 2Gb/s Point-to-Point Heterogeneous Voltage Capable DRAM Interface for Capacity-Scalable Memory Subsystems," *ISSCC 2004/Session 1/DRAM/11.8*, IEEE International Solid-State Circuits Conference (2004).

Kim, Jae-Kwan, et al., "A 3.6Gb/s/pin Simultaneous Bidirectional (SBD) I/O Interface for High-Speed DRAM", *ISSCC 2004/Session 22/DSL and MULTI-Gb/s I/O 22.7*, IEEE International Solid-State Circuits Conference (2004).

"HyperTransport TM I/O Link Specification", Revision 2.00, Document No. HTC20031217-0036-00, HyperTransportTM Technology Consortium, pp. 1-325 (2001).

"IEEE Standard for High-Bandwidth Memory Interface Based on Scalable Coherent Interface (SCI) Signaling Technology (RamLink)", *IEEE Std. 1596.4-1996*, The Institute of Electrical Electronics Engineers, Inc., pp. i-91, (Mar. 1996).

"High-Speed Memory Architectures For Multimedia Applications", *Circuits & Devices*, IEEE 8755-3996/97/, pp. 8-13, Jan. 1997.

Gjessing, S., et al., "RamLink: A High-Bandwidth Point-to-Point Memory Architecture", IEEE 0-8186-2655-0/92, pp. 328-331, 1992.

Gjessing, S., et al., "Performance of the RamLink Memory Architecture", *Proceedings of the Twenty-Seventh Annual Hawaii International Conference on System Sciences*, IEEE 1060-3425/94, pp. 154-162, 1994.

Gjessing, S., et al., "A RAM link for high speed", *Special Report/Memory*, IEEE Spectrum, pp. 52-53, (Oct. 1992).

Diamond, S. L., "SyncLink: High-speed DRAM for the future", *Micro Standards*, IEEE Micro, pp. 74-75, (Dec. 1996).

"DDR2 Fully Buffered DIMM 240pin FBDIMMS based on 512Mb C-die", Rev. 1.3 Sep. 2006, Samsung Electronics, pp. 1-32 (Sep. 2006).

"HyperTransportTM IO Link Specification", Revision 3.00, Document No. HTC20051222-0046-0008, HyperTransport Technology Consortium, pp. 1-428, (Apr. 2006).

"8-megabit 2.5-volt Only or 2.7-volt Only DataFlash®," technical specification, Atmel, Rev. 2225H-DFLSH (2004).

"K9XXG08UXM Preliminary Flash Memory," technical specification, Samsung Electronics.

"1024K1²C™ CMOS Serial EEPROM," technical specification, Microchip Technology Inc. (2006).

"The I²C-Bus Specification," Version 2.1, Philips Semiconductors, Jan. 2000.

"16 Mbit LPC Serial Flash," technical specification, Silicon Storage Technology Inc. (2006).

"16 Mbit SPI Serial Flash," preliminary specification, Silicon Storage Technology Inc. (2005).

"2Mbit, Low Voltage, Serial Flash Memory with 40 MHz SPI Bus Interface," technical specification, STMicroelectronics Group of Companies (2005).

* cited by examiner

DAISY CHAIN CASCADE CONFIGURATION RECOGNITION TECHNIQUE

RELATED APPLICATIONS

This application claims the benefit of U.S. Provisional Application No. 60/787,710, filed on Mar. 28, 2006, the entire teachings of which are incorporated herein by reference.

BACKGROUND OF THE INVENTION

A typical computer-based system comprises a system board and optionally one or more peripheral devices, such as display units and disk units. The system board often contains one or more processors, a memory subsystem and other circuitry, such as serial device interfaces, network device controllers and hard disk controllers.

The type of processors that are employed on a particular system board usually depends on the type of tasks performed by the system. For example, a system that performs a limited set of tasks, such as monitor emissions generated by an automobile engine and adjust an air/fuel mixture to ensure the engine is burning fuel completely may employ a simple specialized processor that is tailored to performing these tasks. On the other hand, a system that performs many different tasks, such as managing many users and running many different applications, may employ one or more complex processors that are general purpose in nature, configured to perform high-speed calculations and manipulate data to minimize the response time to servicing the users' requests.

The memory subsystem is a storage that holds information (e.g., instructions, data values) used by the processors. The memory subsystem typically comprises controller circuitry and one or more memory devices. The controller circuitry is usually configured to interface the memory devices with the processors and enable the processors to store and retrieve information to and from the memory devices. The memory devices hold the actual information.

Like the processors, the type of devices employed in a memory subsystem is often driven by the type of tasks performed by the computer system. For example, a computer system may have the task of having to boot without the assistance of a disk drive and execute a set of software routines that do not change often. Here, the memory subsystem may employ non-volatile devices, such as Flash memory devices, to store the software routines. Other computer systems may execute very complex tasks that require a large high-speed data store to hold large portions of information. Here, the memory subsystem may employ high-speed high-density Dynamic Random Access Memory (DRAM) devices to store the information.

Demand for Flash memory devices has continued to grow significantly because these devices are well suited in various embedded applications that require non-volatile storage. For example, Flash is widely used in various consumer devices, such as digital cameras, cell phones, USB Flash drives and portable music players, to store data used by these devices. Market demand for Flash memory has led to tremendous improvements in Flash memory technology over the past several years both in terms of speed and density. These improvements have led to the prediction that Flash memory-based devices may one day replace hard disk drives in applications that continue to use disk drives for mass storage.

SUMMARY OF THE INVENTION

Some Flash devices employ serial interfaces that are used to perform operations, such as read, write and erase operations, on memory contained in the devices. These operations are typically selected on a device using command strings that are serially fed to the devices. The command strings typically contain a command that represents the operation to be selected as well as parameters. For example, a write operation may be selected by serially feeding an information string to the device that contains a write command, the data to be written and an address in the memory where the data is to be written.

Some memory subsystems employ multiple Flash devices with serial interfaces. Here, a plurality of devices may be configured in a parallel or multi-drop arrangement, wherein each device receives commands through a signal path connected to the controller. Alternatively, the devices may be configured in a daisy chain cascade arrangement, wherein signals are transmitted from each device to the successive device in the chain. Still other configurations may employ both multi-drop and serial configurations, where some signals are received in parallel and others are transmitted through a daisy chain cascade.

In a daisy chain cascade configuration, a command string may be fed to all of the devices even though the command may only be performed on one of the devices. A first device in the daisy chain cascade receives a command string from the controller. The command string is then transmitted to each successive device by the preceding device in the daisy chain cascade, until the command is received by all devices. Each device also responds to commands addressed to it, transmitting responsive data through the daisy chain cascade to the controller.

Memory devices utilized in a daisy chain cascade may require an indication of such a configuration. For example, a Flash memory device may be suitable for operation as a single device or as one of a plurality of memory devices in a daisy chain cascade or multi-drop configuration, or may be utilized interchangeably between multiple configurations. Because these configurations require different modes of operation, a memory device operating in a daisy chain cascade must recognize that it is so configured.

Embodiments of the present invention provide systems and methods of recognizing a daisy chain cascade configuration of devices. Input circuitry receives an input signal at a device, the input signal indicating device configuration following a power-up, reset or other event associated with the device. A signal generator generates an indicator such as a pulse in response to the operation, the indicator occurring while the input signal indicates device configuration. A storage mechanism such as a state latch register stores the state of the input signal in response to the received indicator, thereby storing a state indicating configuration of the respective device. As a result, an embodiment of the present invention recognizes whether the device is connected in a daisy chain cascade configuration and provides an indication that enables the device to operate according to the configuration.

Following this operation, further embodiments permit the input circuitry to receive signals unrelated to the device configuration, thereby obviating the need for additional pin assignment. For example, the input circuitry may receive control or chip select signals. The respective device may be a memory device configured in a plurality of memory devices, such as Flash memory devices connected serially in a daisy chain cascade.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1A:
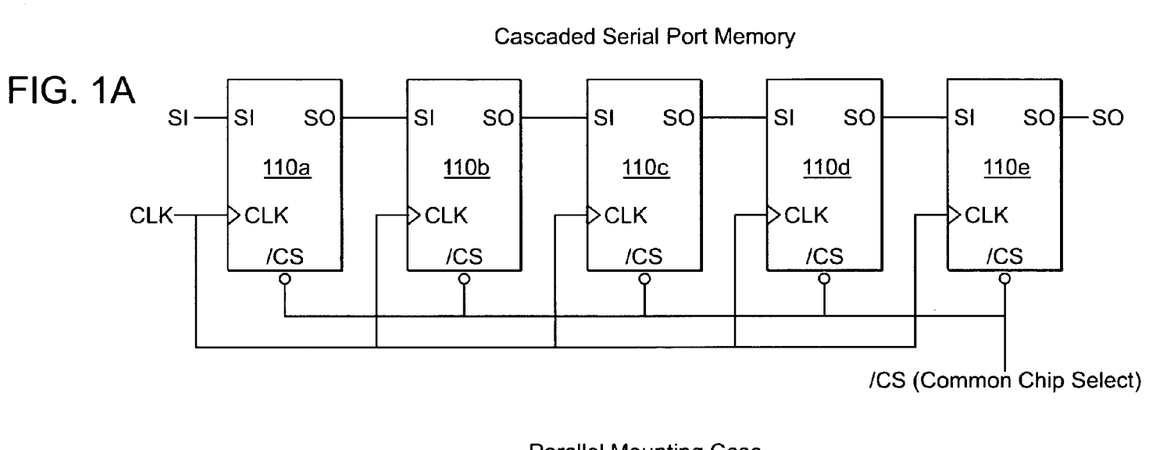
FIGS. 1A and 1B are block diagrams of device configurations comprising a plurality of single port devices in which embodiments of the present invention may be implemented.

FIG. 1A is a block diagram of an exemplary device configuration comprising a plurality of single port devices configured in a serial daisy chain cascade arrangement having inputs and outputs for various signals. The devices 110a-e are memory devices, each of which contains a memory (not shown) such as Dynamic Random Access Memory (DRAM) cells, Static Random Access Memory (SRAM) cells, or Flash memory cells.

Each device 110 comprises a serial input (SI), serial output (SO), chip select (CS#), and clock input (CLK). The input SI is used to transfer information (e.g., command, address and data information) into the device 110. The output SO is used to transfer information from the device 110. Input CLK receives an external clock signal to the devices 110a-d and the CS# input receives a chip select signal, which enables operations at all devices simultaneously.

The ports SI and SO are connected between devices 110 in the daisy chain cascade arrangement such that the output SO of a device 110 earlier in the daisy chain cascade is coupled to the SI of the next device 110 in the daisy chain cascade. For example, port SO of device 110a is coupled to the SI of device 110b. The CLK input of each device 110 is fed with a clock signal from, e.g., a memory controller (not shown). The clock signal is distributed to each device 110 via a common link. As will be described further below, CLK is used to, among other things, latch information input to the device 110 at various registers contained in the device 110.

The CS# input of each device is a conventional chip select that selects the device. This input is coupled to a common link that enables a chip select signal to be asserted to all of the devices 110 concurrently and consequently selects all of the devices 110a-e simultaneously. The CS# input and CLK inputs are coupled to separate links that distribute the CS# and CLK signals, respectively, to the devices 110a-e, as described above.

Information transmitted to the devices 110a-e may be latched at different times of the clock signal fed to the CLK input. For example, in a single data rate (SDR) implementation, information input to the device 110 at the SI may be latched at either the rising or falling edge of the CLK clock signal. Alternatively, in a double data rate (DDR) implementation, both the rising and falling edges of the CLK clock signal may be used to latch information input at the SI.

The configuration of the devices 110a-e in FIG. 1A includes both a serial daisy chain cascade (e.g., input SI and output SO) and conventional multi-drop connections (e.g., CLK and CS#). Thus, the configuration may be referred to as a hybrid of daisy chain cascade and multi-drop configurations, where the advantages of each may be realized. Alternatively, embodiments of the techniques described herein may be implemented in serial, parallel, multi-drop or other connections, and combinations thereof, between devices. Refer to U.S. patent application Ser. No. 11/496,278, titled "Daisy Chain Cascading Devices," the entire teachings of which are incorporated by reference herein, for further information regarding communication and configuration of devices in a daisy chain cascade.

Figure 1B:
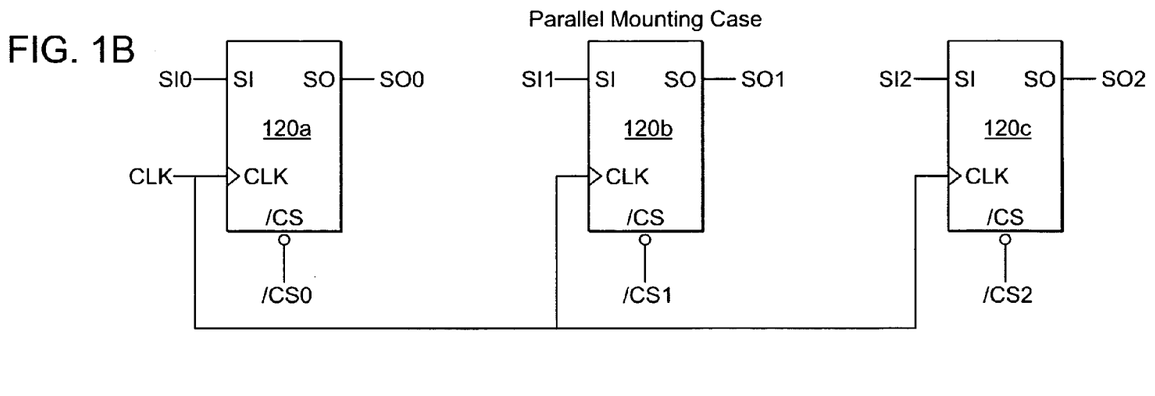

FIG. 1B is a block diagram of a plurality of devices 120a-c configured in parallel communication with a controller (not shown). Each device 120a-c includes a serial input (SI), serial output (SO), chip select (CS#), and clock input (CLK). The input SI is used to transfer information (e.g., command, address and data information) into the device 120. The output SO is used to transfer information from the device 120. Input CLK receives an external clock signal to the devices 120a-c and the CS# input receives a chip select signal, which enables operations at each device independently of the other devices.

The devices 120a-c are configured in a parallel arrangement, utilizing multi-drop connections at the communication ports SI and SO for communication with a controller. Separate CS inputs at each device 120a-c allow the device to be enabled individually. Therefore, a controller connected to the devices 120 in a multi-drop arrangement may control each device 120a-c by first transmitting to its corresponding CS input, and then sending and receiving data at the corresponding ports SI and SO. For example, a controller may communicate with device 120a by first selecting it with a signal at input CS0. Once the device is enabled, the controller can send commands, data and other signals to the device 120a at input SI0, and receive responsive communication from the device at output SO0.

The devices of FIGS. 1A and 1B are illustrated as comprising a serial input SI, serial output SO, clock input CLK and chip select CS. However, as described above, these ports may serve different functions in each configuration. Memory devices comprising memory such as DRAM cells or Flash cells may be implemented as such devices. In some embodiments, an implemented memory device may not be preconfigured for serial or multi-drop operation. For example, a Flash memory device may be suitable for operation in either of the configurations of FIGS. 1A and 1B, and may be utilized interchangeably between these two or other configurations. Because each memory device must be configured for proper operation in a daisy chain cascade or multi-drop setting, the systems of FIGS. 1A and 1B must indicate their respective configurations to their respective devices.

Figure 2:
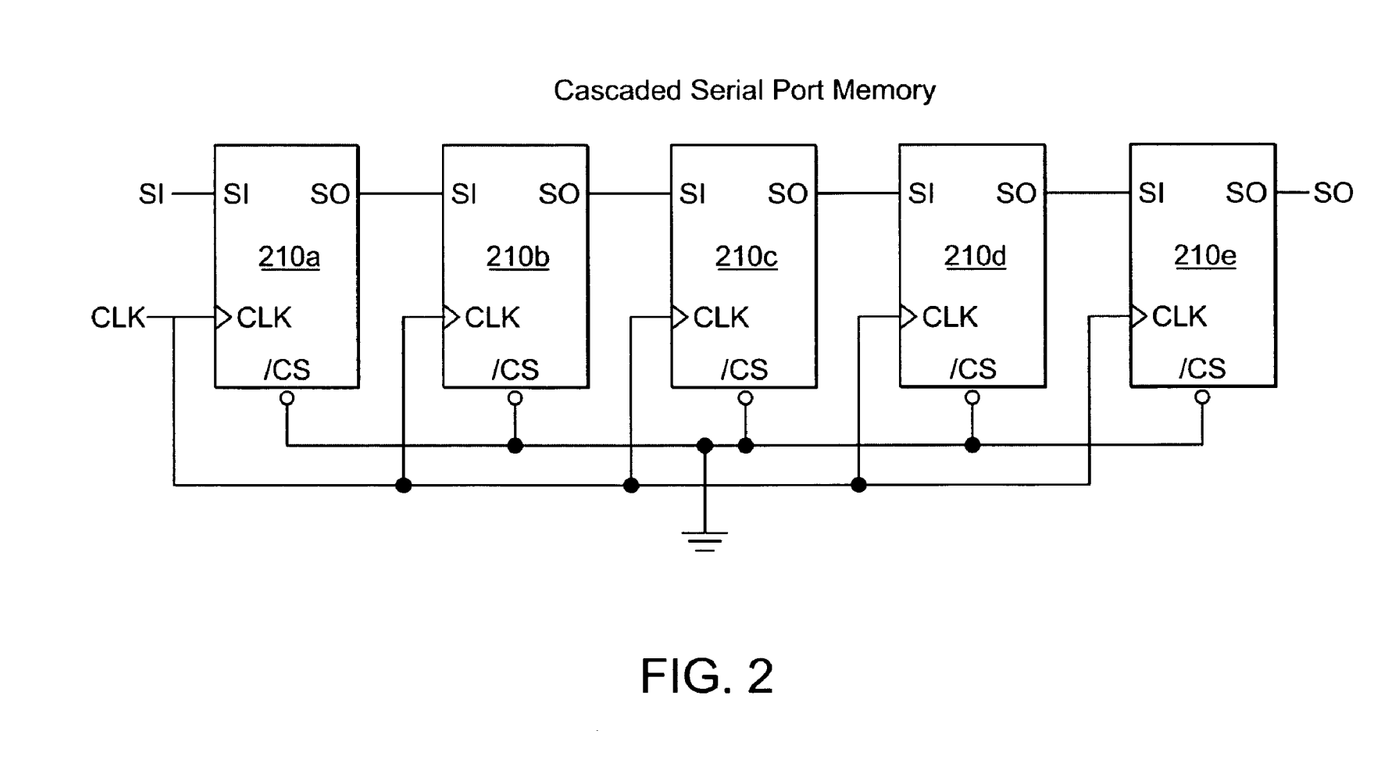
FIG. 2 is a block diagram of a plurality of devices configured for communication in a daisy chain cascade arrangement.

FIG. 2 is a block diagram illustrating a technique for indicating device configuration. Here, devices 210a-e are configured in a serial daisy chain cascade comparable to the configuration of FIG. 1A. However, the inputs CS at all devices 210 are connected to ground, thereby maintaining a constant signal at the CS input at each device 210a-e. Circuitry at each device 210*a-e* receives the CS input and determines whether the device is configured in a daisy chain cascade arrangement during a power-up sequence of the device. If the received CS input is maintained at ground as shown, the circuitry at each device 210*a-e* determines that the device is enabled and configured in a daisy chain cascade.

The technique described above indicates a daisy chain cascade configuration by connecting the chip select input at each device to ground. Alternative embodiments of the devices 210*a-e* can include other inputs that are configured in this manner to indicate a daisy chain cascade configuration. However, the configured input is maintained at ground, and therefore cannot be used in other operations. For example, the CS input at each device 210*a-e* could instead receive an enable signal from a controller for enabling operations at each device. Thus, this technique for indicating a daisy chain cascade configuration requires a dedicated input.

Figure 3:
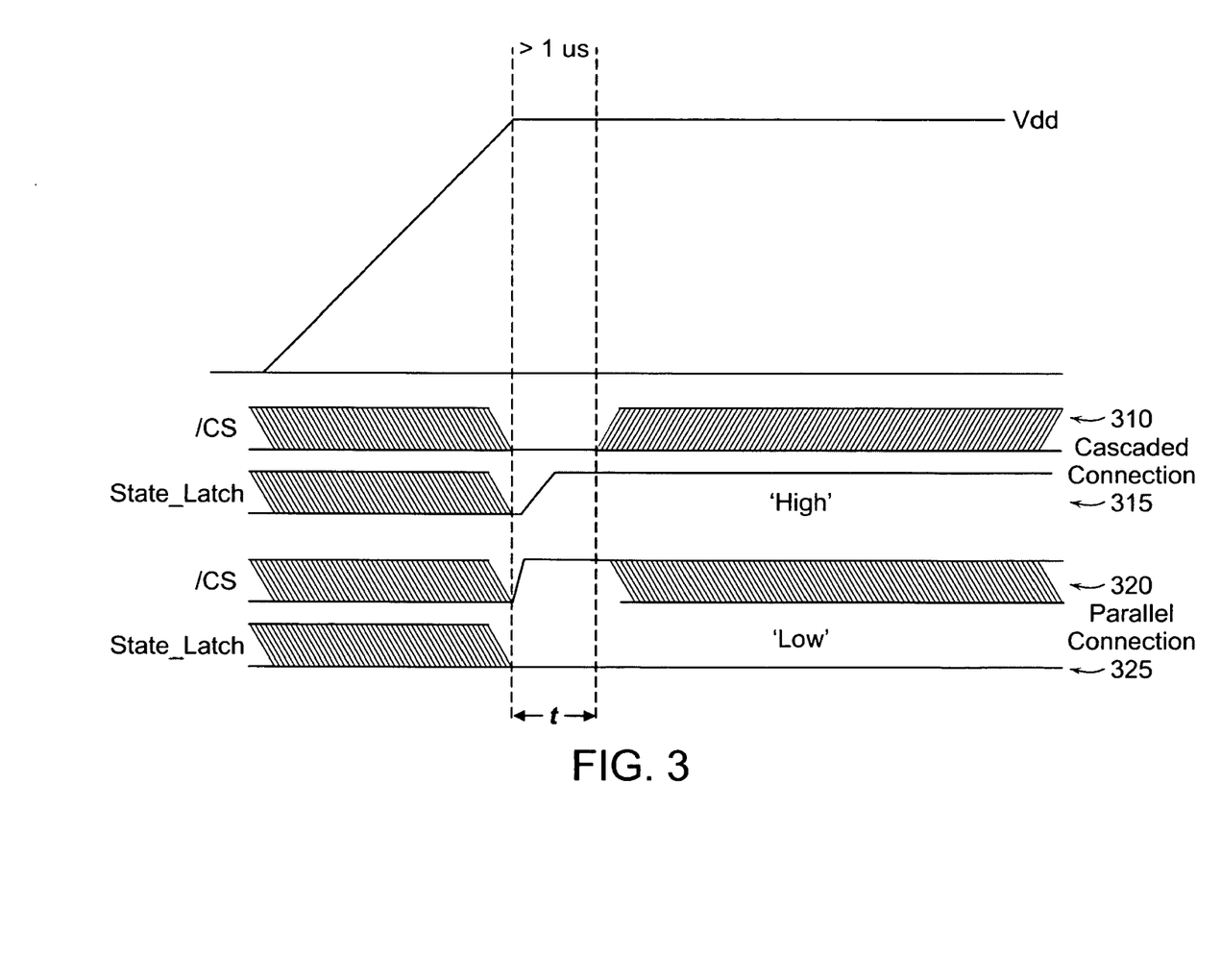
FIG. 3 is a timing diagram of signals occurring during power-up of a device.

FIG. 3 is a timing diagram illustrating signals of two exemplary devices during a power up sequence. Signal Vdd is a reference voltage signal providing power to the exemplary devices, and ramps up until it reaches a reference voltage at the beginning of time t. The signal 310 is a CS input of an exemplary device in a daisy chain cascaded connection, such as one of the devices 110*a-e* in FIG. 1A. The signal 320 is a CS input of an exemplary device in a parallel connection, such as one of the devices 120*a-c* in FIG. 1B. During the time in which Vdd ramps up, both exemplary devices may receive undetermined signals at their respective CS inputs. However, during a time t in which Vdd has reached a reference voltage, the CS input at each device may receive a signal that corresponds to whether the device is configured in a daisy chain cascade or in parallel. Here, the CS signal 310 in a daisy chain cascaded connection is low during time t, while the CS signal 320 in a parallel connection is high. Time t may be a short interval, such as a span greater than 1 microsecond, that occurs between the power ramp-up and when the device receives communication signals from a controller. The CS signals 310, 320 may be provided to the devices by a memory controller (not shown) that controls the devices. Such a memory controller may be configured to indicate, by the state of the CS signal 310, 320 during time t, whether the devices it controls are connected in a daisy chain cascaded configuration, in parallel, or as a single device.

Following time t, the CS signal 310, 320 at each device may no longer indicate device configuration, as the signal state may change as determined by a controller. Signals 310 and 320 are accompanied by respective state latch signals 315 and 325. These accompanying signals 315, 325 represent the state of respective latches that receive the state of each CS signal 310, 320. The respective latches latch the inverse state of the CS signals during time t, thereby storing the inverse state of the CS signals 310, 320 at time t. As a result, the state latch signals 315, 325 indicate whether the respective devices are connected in a daisy chain cascade or parallel (or single device) configuration. The devices may respond to the state latch signals 315, 325 by operating according to the indicated configuration. For example, a device receiving the "high" state latch signal 315 (indicating a daisy chain cascaded connection) may be enabled at all times and transmit all commands and data through a serial output. Conversely, a device receiving a "low" state latch signal 325 (indicating a parallel or single device connection) may be enabled by the CS signal 320. Because the state latch signals 315, 325 indicate configuration, CS signals may be used following time t to select the devices or perform other functions.

Figure 4:
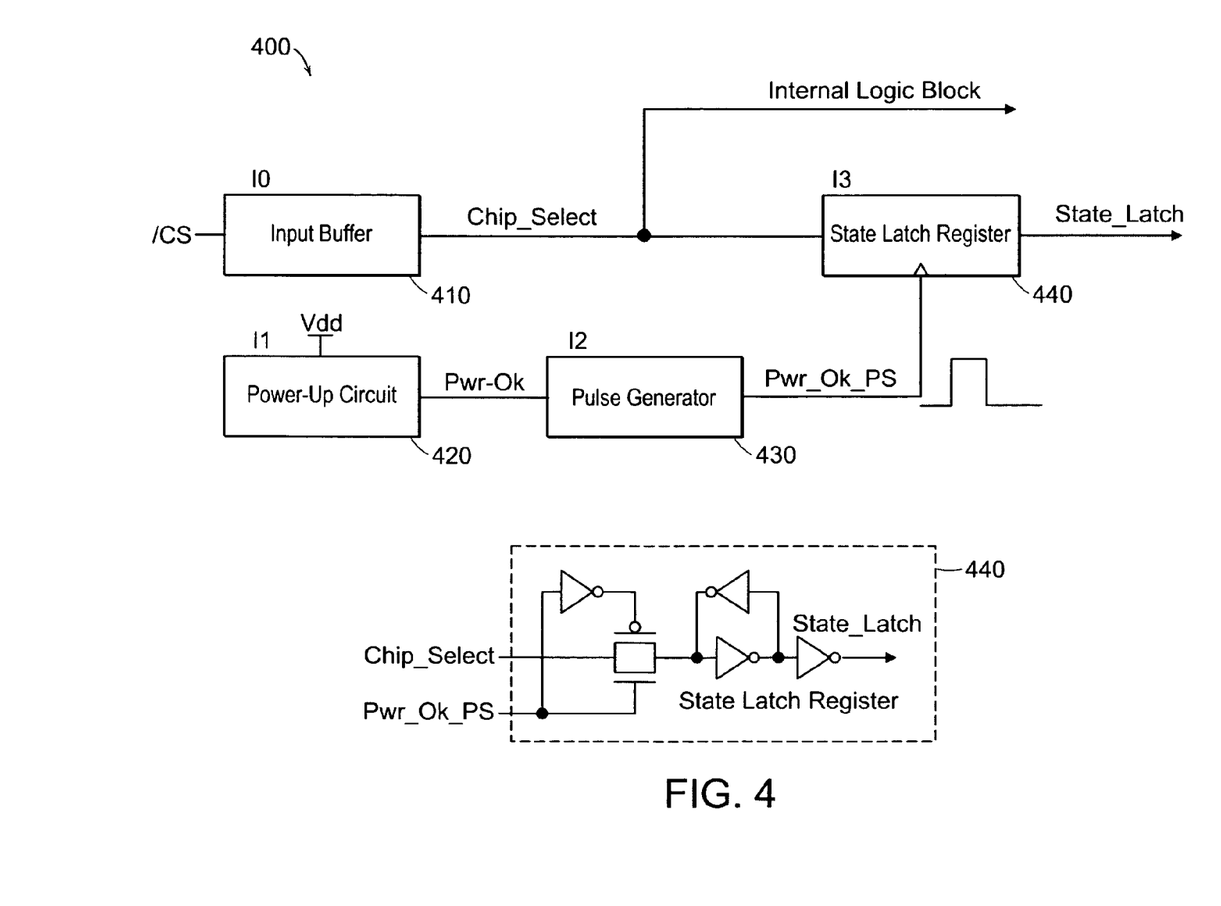
FIG. 4 is a block diagram of a circuit that detects a configuration of a device during power-up.

FIG. 4 is a block diagram of latching circuitry 400 that stores the state of received signal CS during a power up sequence of a device. The circuit may be internal to a device such as one of the devices 110*a-e*, 120*a-c* of FIG. 1, the device being a single device controlled by a controller or as one of a plurality of devices in a daisy chain cascade or parallel configuration. The circuit includes an input buffer 410, power-up circuit 420, pulse generator 430 and state latch register 440.

Input buffer 410 receives a CS signal and outputs a corresponding signal "chip_select" to the state latch register 440 and an internal logic block that receives the CS signal. The power-up circuit 420 receives a reference voltage Vdd and outputs a signal "pwr_ok" that is high when Vdd is ramped up. The pulse generator 430 receives the signal "pwr_ok" and outputs a pulse in response to a transition of "pwr_ok" to high. The state latch register 440 (shown in the circuit 400 as well as inset below the circuit 400) receives the pulse and the signal "chip select," and stores the state of signal "chip select" by latching it while the pulse is received.

The pulse is provided as an indicator, and may be a signal of any duration that accommodates this latching operation. In the present embodiment, the pulse generator 430 generates a pulse signal "pwr_ok_ps" in response to the device completing a power ramp-up. For a time period following the power ramp-up, the CS signal indicates whether the device is configured in a daisy chain cascade arrangement, a parallel connection, or as a single device (e.g., CS being low indicates a daisy chain cascade, while CS being high indicates a parallel or single device connection). In order for the state latch register 440 to store the CS signal providing this indication, the pulse generator 430 must enable the state latch register 440 during the aforementioned time period.

Figure 5:
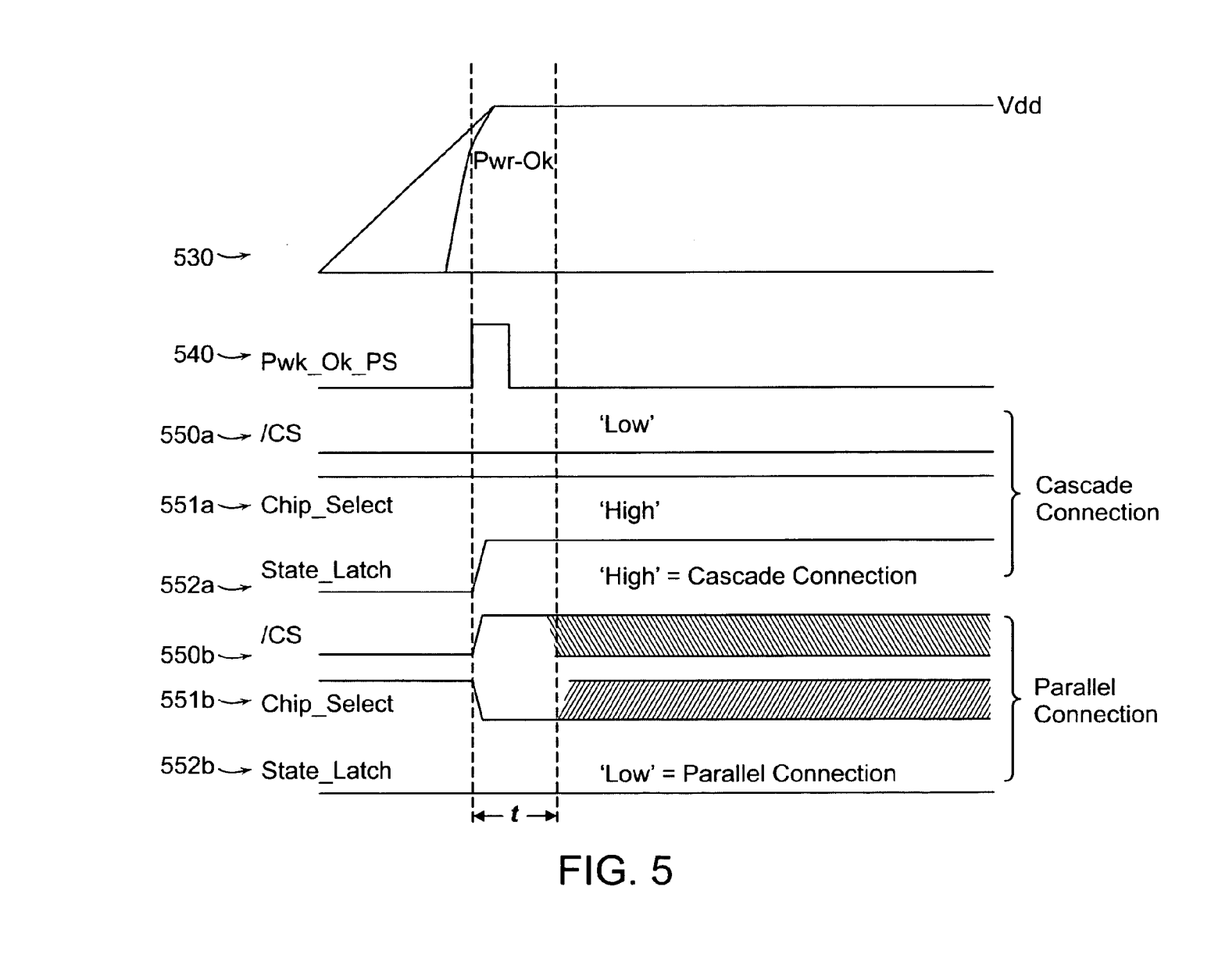
FIG. 5 is a timing diagram of signals occurring at the circuit of FIG. 4.

FIG. 5 is a timing diagram illustrating signals corresponding to the circuit 400 of FIG. 4. The signals are shown during a power up sequence of the device receiving a reference voltage Vdd. The signal "pwr_ok" at line 530 is high when Vdd has reached a predetermined voltage. This time coincides with a time t in which the input signal CS 550*a-b* indicates whether the device is in a daisy chain cascade or parallel configuration. Signal "chip_select" 551*a-b* provides a signal inverted from the CS signal 550*a-b*. Thus, a pulse generator generates a pulse signal 540 during time t, enabling a state latch register to latch the state of the signal "chip_select" 551*a-b* during this time t, as shown by the signals "state latch" 552*a-b*.

Signals 550*a*-552*a* correspond to a device in a daisy chain cascade arrangement, while signals 550*b*-552*b* correspond to a device in a parallel connection. As a result of latching the respective "chip_select" signals 551*a-b* while they indicate the device configuration, the signals 552*a-b* maintain a state indicating the configuration of the respective devices.

Figure 6:
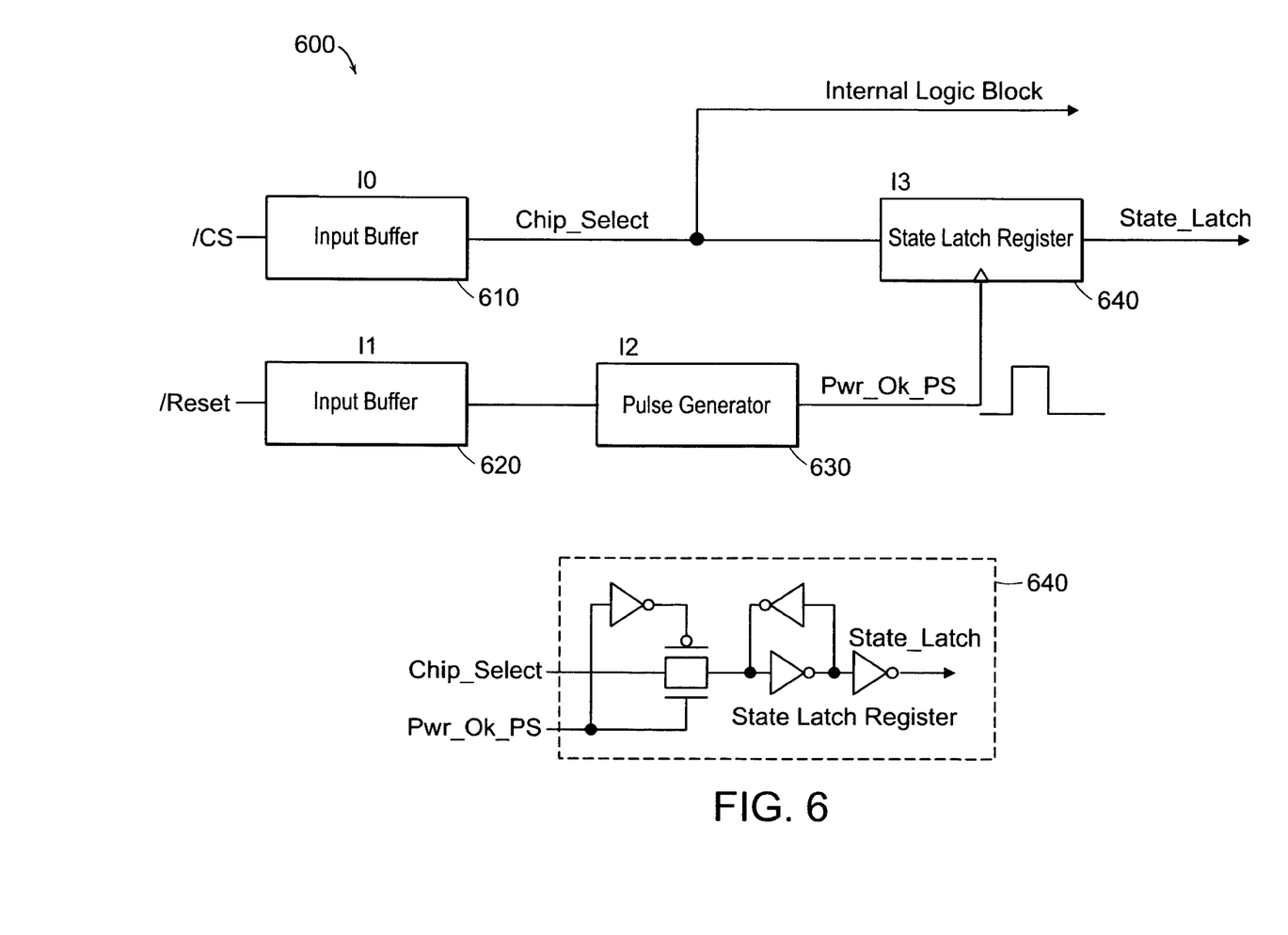
FIG. 6 is a block diagram of a circuit that detects a configuration of a device following a device reset.

FIG. 6 is a block diagram of an alternative embodiment of latching circuitry 600 for storing the state of the received CS signal. The circuit may be internal to a device such as one of the devices 110*a-e*, 120*a-c* of FIG. 1, the device being a single device controlled by a controller or as one of a plurality of devices in a daisy chain cascade or parallel configuration. The circuit includes an input buffers 610, 620, pulse generator 630 and state latch register 640, the functions of which may be comparable to the corresponding components of the circuit 400 of FIG. 4. Input buffer 620 receives a signal "reset," which may be transmitted to the device to reset one or more configurations at the device. The pulse generator 630 generates a pulse in response to the signal "reset." The state latch register 640 latches the state of the signal "chip select" during the pulse, thereby storing a state corresponding to the CS signal following a device reset operation.

Figure 7:
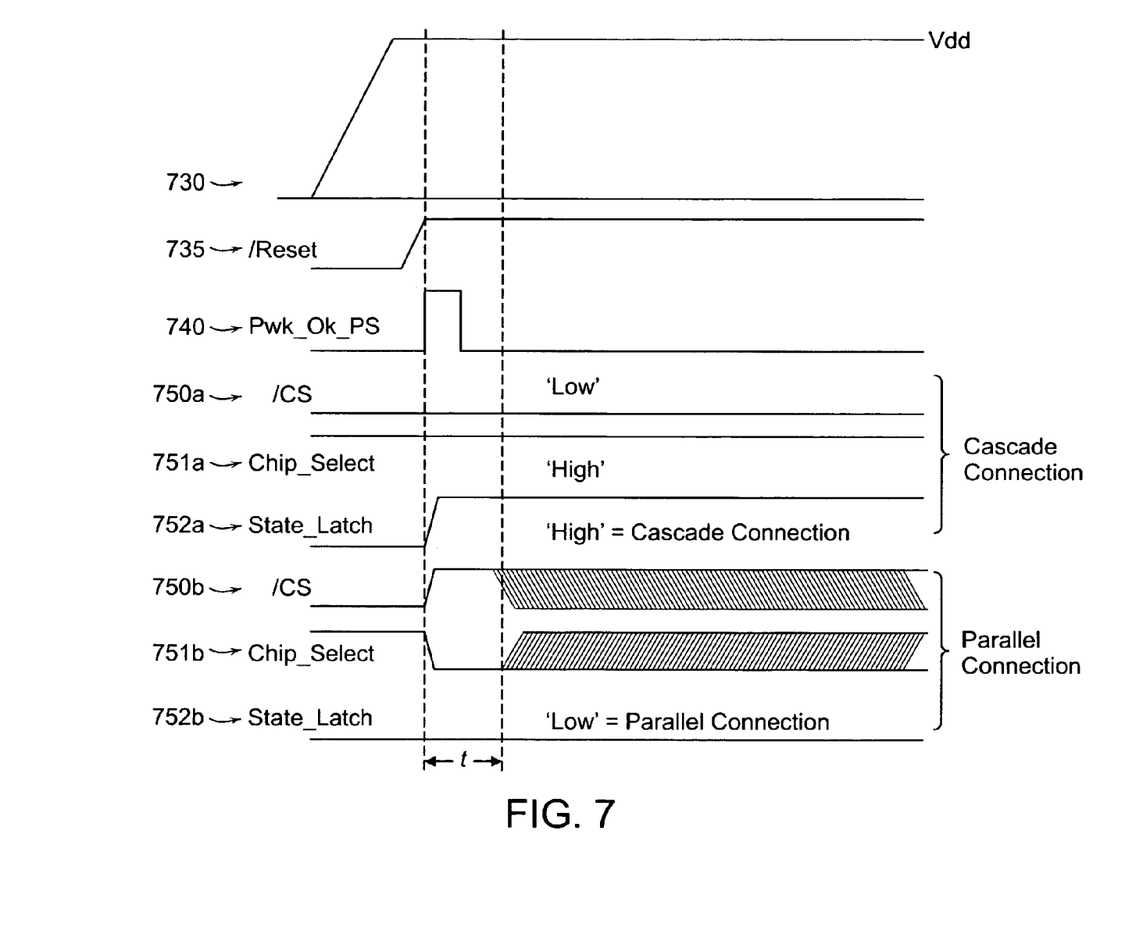
FIG. 7 is a timing diagram of signals occurring at the circuit of FIG. 6.

FIG. 7 is a timing diagram illustrating signals corresponding to the circuit 600 of FIG. 6. The signals are shown during a power up sequence of the device receiving a reference voltage Vdd 730. Following the power up sequence, the signal "reset" is asserted. During a time t following the assertion of the signal "reset," CS signal 750*a-b* indicates the device configuration. In particular, CS signal 750*a* is low, indicating a daisy chain cascade connection; while CS signal 750*b* is high, indicating a parallel connection. The CS signals 750*a-b* are buffered, resulting in respective "chip_select" signals 751*a-b*. During time t, the state of the "chip_select" signals 751*a-b* are latched by a state latch, providing respective "state_latch" signals 752*a-b* that maintain the latched state beyond time t. Thus, the circuit 600 recognizes whether the device is connected in a daisy chain cascade configuration, stores a state indicating the device configuration, and permits a related input port to receive communications after the configuration is recognized.

Figure 8:
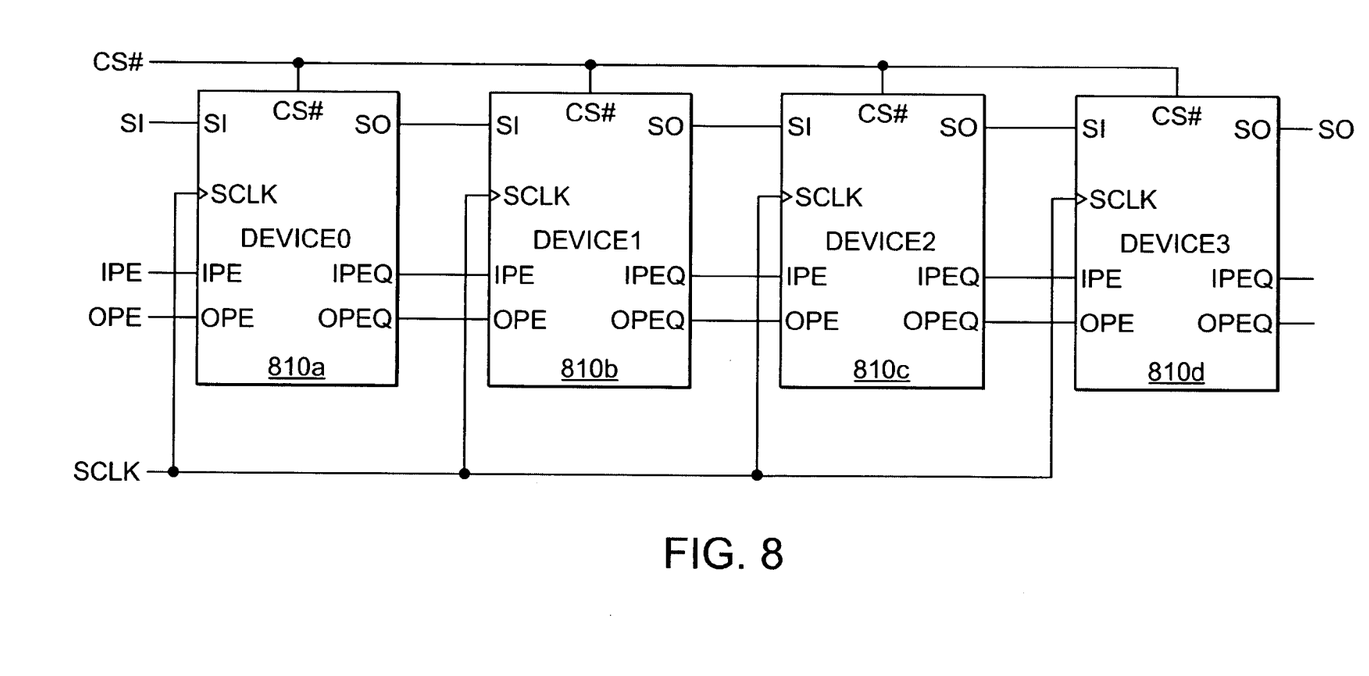
FIG. 8 is a block diagram of a plurality of devices configured for communication in a daisy chain cascade arrangement.

FIG. 8 is a block diagram of an exemplary device configuration comprising a plurality of single port devices configured in a serial daisy chain cascade arrangement having inputs and outputs for various signals. The devices 810*a-d* are memory devices, each of which contains a memory (not shown) such as Dynamic Random Access Memory (DRAM) cells, Static Random Access Memory (SRAM) cells, or flash memory cells. The latching circuitry 400, 600 in FIGS. 4 and 6 may be incorporated into each of the devices 810*a-d*. As such, the latching circuitry 400, 600 may latch the state of the signal CS# when it indicates that the devices 810*a-d* are configured in a daisy chain cascade.

Each device 810 comprises a serial input (SI), serial output (SO), chip select (CS#), and clock input (SCLK), described above with reference to FIG. 1A. In addition, each device 810 comprises an input port enable (IPE) input, output port enable (OPE) input, input port enable output (IPEQ) and output port enable output (OPEQ). The IPE input receives an IPE signal to the device. The IPE signal may indicate to the device to enable the SI such that when IPE is asserted information may be serially input to the device 810 via the SI. Likewise, the OPE input receives an OPE signal to the device. The OPE signal is used by the device to enable the SO such that when OPE is asserted information may be serially output from the device 810 via the SO. The IPEQ and OPEQ are outputs that output the IPE and OPE signals, respectively, from the device. The CS# input and SCLK inputs are coupled to separate links that distribute the CS# and SCLK signals, respectively, to the devices 410*a-d*, as described above.

The SI and SO are coupled from one device to the next in a daisy chain cascade arrangement, as described above. Moreover, the IPEQ and OPEQ of an earlier device 810 in the daisy chain cascade are coupled to the IPE input and OPE input, respectively, of the next device 410 in the daisy chain cascade arrangement. This arrangement allows IPE and OPE signals to be transferred from one device to the next (e.g., device 810*a* to device 810*b*) in a serial daisy chain cascade fashion.

Information transmitted to the devices 810*a-d* may be latched at different times of the clock signal fed to the SCLK input. For example, in a single data rate (SDR) implementation, information input to the device 810 at the SI may be latched at either the rising or falling edge of the SCLK clock signal. Alternatively, in a double data rate (DDR) implementation, both the rising and falling edges of the SCLK clock signal may be used to latch information input at the SI.

Figure 9:
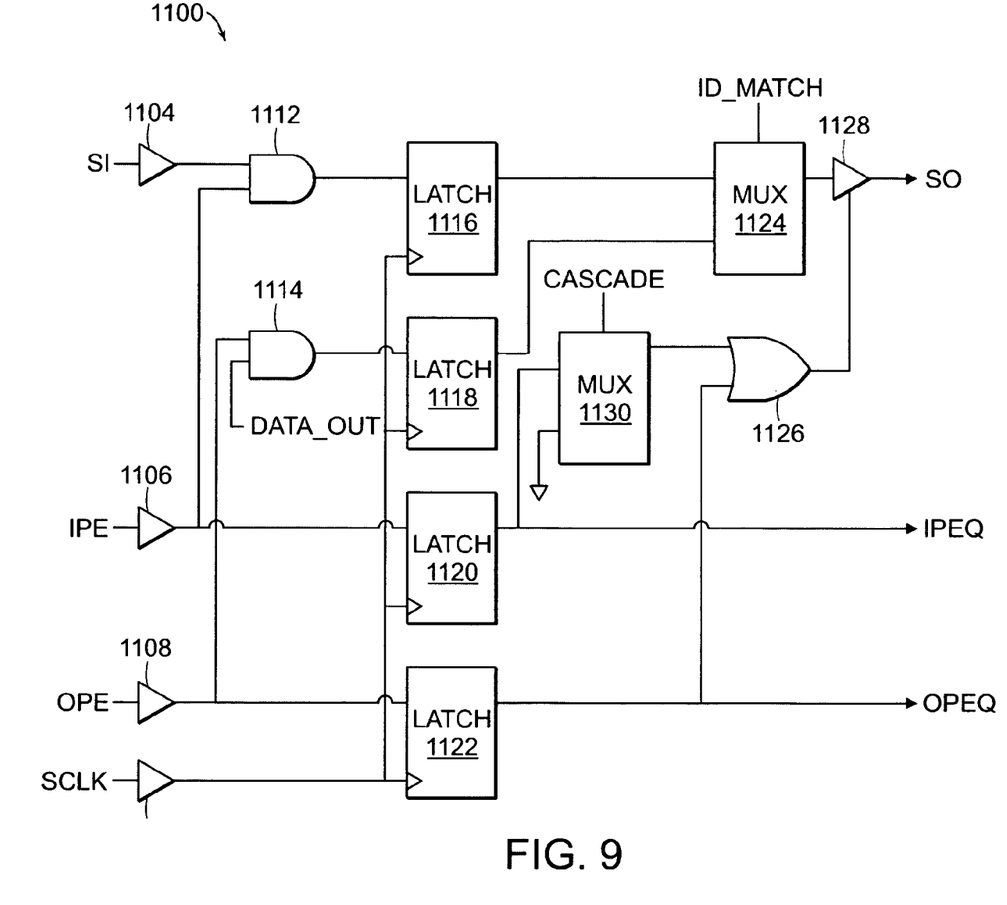
FIG. 9 is a block diagram of serial output control logic that may be incorporated into devices configured for communication in a daisy chain cascade arrangement.

FIG. 9 is a block diagram of serial output control logic 1100 that may be incorporated into each of the devices 810*a-d* of FIG. 8. Logic 1100 comprises an SI input buffer 1104, an IPE input buffer 1106, an OPE input buffer 1108, an SCLK input buffer 1110, logical AND gates 1112 and 1114, latches 1116, 1118, 1120 and 1122, selectors 1124 and 1130, logical OR gate 1126 and an SO output buffer 1128. Buffers 1104, 1106, 1108 and 1110 may be conventional LVTTL buffers configured to buffer SI, IPE, OPE and SCLK signals, respectively, that are inputted to the device.

The output control logic 1100 controls input and output signals according to the received control signals. As described above with reference to FIG. 1, a device connected in a daisy chain cascade arrangement (e.g. device 110*a*) operates differently from a device connected in parallel (e.g., device 120*a*) or as a single device. Therefore, the control logic 1100 receives a signal indicating whether the device is configured in a daisy chain cascade, signal CASCADE. Latching circuitry 400, 600 may be incorporated into a device with serial control logic 1100. If so, the signal State_latch signal output by the latching circuitry 400, 600 would be received by the output control logic 1100 as the signal CASCADE, described below.

The buffered SI signal is received by AND gate 1112, which sends the signal to latch 1116 when IPE is asserted. Latch 1116 is configured to latch the information when a clock signal (SCLK) is provided by buffer 1110. DATA_OUT represents the state of data read from a memory (not shown) contained in the device. AND gate 1114 is configured to output a state of DATA_OUT when OPE is asserted. The output of AND gate 1114 feeds latch 1118 which is configured to latch the state of DATA_OUT when a clock signal is provided by buffer 1110. Buffer 1106 is configured to buffer the IPE signal fed to the device. The output of buffer 1106 is latched by latch 1120. Likewise, buffer 1108 is configured to buffer the OPE signal fed to the device. Latch 1122 is configured to latch the state of OPE as output by buffer 1108. Selectors 1124 and 1130 are conventional 2-to-1 multiplexers each comprising two inputs. The inputs for selector 1124 are selected for output from the selector 1124 by the above-described ID_MATCH signal. One input is fed with the latched state of DATA_OUT as maintained by latch 1118. This input is selected for output from selector 1124 when ID_MATCH is asserted. The other input is fed with the latched state of SI as maintained by latch 1116. This input is selected for output from the selector 1124 when ID_MATCH is not asserted.

The signal CASCADE indicates whether the device is coupled to one or more other devices in a daisy chain cascade arrangement. Illustratively, this signal is asserted if the device is coupled to one or more devices in a daisy chain cascade arrangement. For example, the signal may be asserted by the state latch 440, 640 of respective latching circuitry 400, 600 when indicating that the device is configured in a daisy chain cascade. Asserting the CASCADE signal causes the latched state of the IPE signal fed to the selector 1130 to be output from the selector 1130. When CASCADE is not asserted, the logic low condition input to the selector 1130 is output from the selector 1130. The inputs for selector 1130 are selected for output from the selector 1130 by the CASCADE signal. One input to selector 1130 is fed with the latched state of IPE as maintained by latch 1120 and the other input is tied to a logical zero. The latched state of IPE is selected for output from the selector 1130 when CASCADE is asserted.

Conversely, if CASCADE is not asserted, logical zero is selected for output from the selector 1130. The signal IPE therefore cannot be asserted to enable the serial output of the device. As a result, output buffer 1128 is enabled only by the OPE, thereby controlling the serial output as indicated by the output enable signal. This configuration is suitable where the device is not connected in a daisy chain cascade.

OR gate 1126 provides an enable/disable signal to output buffer 1128. The gate 1126 receives the output of selector 1130 and the latched state of OPE, as maintained by latch 1122. Either of these outputs may be used to provide an enable signal to buffer 1128 to enable the buffer's output. Buffer 1128 is a conventional buffer that buffers output signal SO. As noted above, buffer 1128 is enabled/disabled by the output of OR gate 1126.

Operationally, when IPE is asserted, information that is input to the device via SI is fed to latch 1116. Latch 1116 latches this information illustratively at the first upward transition of SCLK after IPE is asserted. Likewise, latch 1120 latches the state of IPE at this SCLK transition. Providing that ID_MATCH is not asserted (indicating that a command is not addressed to the device), the output of latch 1116 is fed to buffer 1128 via selector 1124. Likewise, the asserted IPE is transferred from buffer 1106 to latch 1120 where it is also illustratively latched by the first upward transition of SCLK. Assuming CASCADE is asserted, the latched state of IPE is provided at the output of selector 1130 and transferred to OR gate 1126 to provide an enable signal to buffer 1128. The latched state of SI is then transferred from the device via buffer 1128 as output SO.

Illustratively, at the next upward transition of SCLK after OPE is asserted, the asserted state of OPE is latched at latch 1122 and the state of DATA_OUT is latched at latch 1118. Providing that ID_MATCH is asserted, the latched state of DATA_OUT is selected by selector 1124 and applied to the input of buffer 1128. Simultaneously, the latched asserted state of OPE from latch 1122 passes through OR gate 1126 to enable buffer 1128 which causes the latched state of DATA_OUT to be output from the device as output SO.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus for recognizing a daisy chain cascade configuration of devices, the apparatus comprising:
   an input port at a memory device, the port receiving an input signal;
   a signal generator that provides an indicator in response to a reset event, the indicator occurring during a time period in which the input signal indicates whether the memory device is configured in either a daisy chain cascade configuration or a non-daisy chain configuration, the input port, following the time period, receiving one of a control signal and a data signal associated with the memory device;
   a storage mechanism that stores a state of the input signal during the time period; and
   output control logic configured to select between a plurality of output modes in accordance with the state of the input signal during the time period, the output control logic providing at least one output signal according to the selected output mode.

2. The apparatus of claim 1, wherein the control signal is a chip select signal.

3. The apparatus of claim 1, wherein the memory device is configured in a daisy chain cascade comprising a plurality of memory devices.

4. The apparatus of claim 3, wherein the plurality of memory devices include Flash memory devices in serial communication.

5. The apparatus of claim 1, wherein the signal generator receives an event signal corresponding to the reset event.

6. The apparatus of claim 1, wherein the reset event includes at least one of a powering up of the memory device and a reset of the memory device.

7. The apparatus of claim 1, wherein the memory device operates in a daisy chain cascade configuration in response to the state of the input signal indicating the daisy chain cascade configuration.

8. The apparatus of claim 1, wherein the register includes a state latch that latches the state of the input signal in response to the indicator.

9. A method of recognizing a daisy chain cascade configuration of devices, the method comprising:
   receiving an input signal at an input port of a memory device;
   generating a pulse in response to a reset event, the pulse occurring during a time period in which the input signal indicates whether the memory device is configured in either a daisy chain cascade configuration or a non-daisy chain configuration, the input port, following the time period, receiving one of a control signal and a data signal associated with the memory device;
   storing a state of the input signal during the time period;
   selecting between a plurality of output modes in accordance with the state of the input signal during the time period; and
   providing at least one output signal according to the selected output mode.

10. The method of claim 9, wherein the control signal is a chip select signal.

11. The method of claim 9, wherein the memory device is configured in a daisy chain cascade comprising a plurality of memory devices.

12. The method of claim 11, wherein the plurality of memory devices include Flash memory devices in serial communication.

13. The method of claim 9, further comprising receiving an event signal corresponding to the reset event.

14. The method of claim 9, wherein the reset event includes a powering up of the memory device.

15. The method of claim 9, wherein the reset event includes a reset of the memory device.

16. The method of claim 9, wherein the storing a state of the input signal includes latching the state of the input signal in response to the pulse.

17. A memory device comprising:
   an input port;
   recognition circuitry that responds to a reset event to recognize the status of an input at the input port at a time of the event, the memory device being configured as either a daisy chain cascade device or a non-daisy chain configuration dependent on the recognized status, the input port, following the time period, receiving one of a control signal and a data signal associated with the memory device; and
   output control logic configured to select between a plurality of output modes in accordance with the state of the input signal during the time period, the output control logic providing at least one output signal according to the selected output mode.

18. The device of claim 17, wherein the control signal is a chip select signal.

19. The device of claim 17, wherein the memory device is configured in a daisy chain cascade comprising a plurality of memory devices.

20. The device of claim 19, wherein the plurality of memory devices include Flash memory devices in serial communication.

21. The device of claim 17, wherein the reset event includes at least one of a powering up of the memory device and a reset of the memory device.

22. An apparatus for recognizing a daisy chain cascade configuration of devices, the apparatus comprising:
- means for receiving an input signal at an input port of a memory device;
- means for generating a pulse in response to a reset event, the pulse occurring during a time period in which the input signal indicates whether the memory device is configured in either a daisy chain cascade configuration or a non-daisy chain configuration, the input port, following the time period, receiving one of a control signal and a data signal associated with the memory device;
- means for storing a state of the input signal during the time period;
- means for selecting between a plurality of output modes in accordance with the state of the input signal during the time period; and
- means for providing at least one output signal according to the selected output mode.

23. A system for recognizing a daisy chain cascade configuration of devices, the system comprising:
- a plurality of memory devices;
- a memory controller controlling the plurality of memory devices, the memory controller sending a signal to each of the plurality of memory devices;
- latching circuitry at each of the plurality of devices, the latching circuitry latching the signal, in response to a reset event, during a time period in which the signal indicates either a daisy chain cascade configuration or a non-daisy chain configuration, the input port, following the time period, receiving one of a control signal and a data signal associated with the memory device; and
- output control logic at each of the plurality of devices, the output control logic configured to select between a plurality of output modes in accordance with the state of the input signal during the time period, the output control logic providing at least one output signal according to the selected output mode.

24. The system of claim 23, wherein the plurality of memory devices are configured in a daisy chain cascade arrangement.

25. The system of claim 24, wherein the signal indicates that the memory devices are configured in a daisy chain cascade arrangement.

26. The system of claim 23, wherein the plurality of memory devices include Flash memory.

27. The system of claim 23, wherein the reset event one of a power up of the devices and a reset of the devices.

28. The system of claim 23, wherein, after the reset event, the signal is a control signal.

* * * * *